United States Patent
Cao et al.

(10) Patent No.: US 12,322,445 B2
(45) Date of Patent: Jun. 3, 2025

(54) THREE DIMENSIONAL SEMICONDUCTOR MEMORY STRUCTURE

(71) Applicant: Wuhan Xinxin Semiconductor Manufacturing Co., Ltd., Hubei (CN)

(72) Inventors: Kaiwei Cao, Hubei (CN); Peng Sun, Hubei (CN); Jun Zhou, Hubei (CN); Qiong Zhan, Hubei (CN); Wei Huang, Hubei (CN); Chunyuan Hou, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 183 days.

(21) Appl. No.: 17/985,064

(22) Filed: Nov. 10, 2022

(65) Prior Publication Data
US 2023/0073118 A1 Mar. 9, 2023

Related U.S. Application Data

(63) Continuation of application No. PCT/CN2020/107603, filed on Aug. 7, 2020.

(30) Foreign Application Priority Data

Jun. 11, 2020 (CN) .......................... 202010529695.8

(51) Int. Cl.
*G11C 16/08* (2006.01)
*G11C 16/24* (2006.01)
*G11C 16/30* (2006.01)

(52) U.S. Cl.
CPC .............. *G11C 16/08* (2013.01); *G11C 16/24* (2013.01); *G11C 16/30* (2013.01)

(58) Field of Classification Search
CPC ......... G11C 16/08; G11C 16/24; G11C 16/30; G11C 2207/105; G11C 5/025; G11C 5/06;
(Continued)

(56) References Cited

U.S. PATENT DOCUMENTS

| 7,460,385 B2 | 12/2008 | Gruber et al. |
| 7,764,530 B2 | 7/2010 | Gruber et al. |

(Continued)

FOREIGN PATENT DOCUMENTS

| CN | 1781155 A | 5/2006 |
| CN | 101894771 A | 11/2010 |

(Continued)

OTHER PUBLICATIONS

International Search Report regarding Application No. PCT/CN2020/107603 dated Mar. 8, 2021.

*Primary Examiner* — Sultana Begum
(74) *Attorney, Agent, or Firm* — Harness, Dickey & Pierce, P.L.C.

(57) ABSTRACT

Semiconductor structure, comprising a memory-array unit comprising: a substrate, a memory array disposed on the substrate, and a first bonding region disposed around the memory array. The memory array comprises multiple word lines, multiple bit lines, and multiple source lines. The first bonding region comprises a first substrate-connecting bonding region, a first bit-line bonding region, a first word-line bonding region, and a first source-line bonding region. The first substrate-connecting bonding region is configured to connect the substrate electrically to a surface of the memory-array unit, the first bit-line bonding region is configured to connect the bit lines electrically to the surface of the memory-array unit, the first word-line bonding region is configured to connect the word lines electrically to the surface of the memory-array unit, and the first source-line bonding region is configured to connect the source lines electrically to the surface of the memory-array unit.

17 Claims, 7 Drawing Sheets

(58) Field of Classification Search
CPC ......... G11C 29/70; G11C 5/063; G11C 16/06; H10B 41/30; H10B 41/40; H10B 43/30; H10B 43/40

See application file for complete search history.

(56) References Cited

U.S. PATENT DOCUMENTS

| | | | |
|---|---|---|---|
| 8,004,869 B2 | 8/2011 | Gruber et al. |
| 8,105,874 B2 | 1/2012 | Gruber et al. |
| 8,630,114 B2 | 1/2014 | Lue |
| 9,691,782 B1 | 6/2017 | Hwang et al. |
| 9,818,800 B2 | 11/2017 | Sekar et al. |
| 10,608,011 B2 | 3/2020 | Harari et al. |
| 10,692,874 B2 | 6/2020 | Harari et al. |
| 10,756,103 B2 | 8/2020 | Lee |
| 10,818,692 B2 | 10/2020 | Harari et al. |
| 10,930,661 B2 | 2/2021 | Chen et al. |
| 11,031,282 B2 | 6/2021 | Chen et al. |
| 11,043,532 B2 | 6/2021 | Yokoyama et al. |
| 11,251,198 B2 | 2/2022 | Lee |
| 11,309,331 B2 | 4/2022 | Harari et al. |
| 11,437,464 B2 | 9/2022 | Chen et al. |
| 2006/0077723 A1 | 4/2006 | Gruber et al. |
| 2008/0239863 A1 | 10/2008 | Gruber et al. |
| 2009/0052219 A1 | 2/2009 | Gruber et al. |
| 2009/0053854 A1 | 2/2009 | Gruber et al. |
| 2010/0210076 A1 | 8/2010 | Gruber et al. |
| 2012/0182801 A1 | 7/2012 | Lue |
| 2016/0365354 A1 | 12/2016 | Lee |
| 2018/0366471 A1 | 12/2018 | Harari et al. |
| 2018/0366489 A1 | 12/2018 | Harari et al. |
| 2019/0363129 A1 | 11/2019 | Yokoyama et al. |
| 2020/0058669 A1 | 2/2020 | Chen et al. |
| 2020/0258903 A1 | 8/2020 | Harari et al. |
| 2020/0350334 A1 | 11/2020 | Lee |
| 2020/0403002 A1 | 12/2020 | Harari et al. |
| 2021/0013088 A1 | 1/2021 | Chen et al. |
| 2021/0013303 A1 | 1/2021 | Chen et al. |
| 2021/0134824 A1 | 5/2021 | Chen et al. |
| 2021/0265377 A1 | 8/2021 | Chen et al. |
| 2022/0025532 A1 | 1/2022 | Harari et al. |
| 2022/0199643 A1 | 6/2022 | Harari et al. |
| 2022/0208960 A1 | 6/2022 | Chen et al. |

FOREIGN PATENT DOCUMENTS

| | | |
|---|---|---|
| CN | 102610615 A | 7/2012 |
| CN | 106252355 A | 12/2016 |
| CN | 109103194 A | 12/2018 |
| CN | 109155320 A | 1/2019 |
| CN | 110168725 A | 8/2019 |
| CN | 110301037 A | 10/2019 |
| CN | 110506334 A | 11/2019 |
| CN | 110520984 A | 11/2019 |
| CN | 110660805 A | 1/2020 |
| CN | 111033625 A | 4/2020 |
| WO | WO-2019100836 A1 | 5/2019 |

THREE DIMENSIONAL SEMICONDUCTOR MEMORY STRUCTURE

The present application is the Continuation Application of International Application No. PCT/CN2020/107603, titled "SEMICONDUCTOR STRUCTURE", filed on Aug. 7, 2020, which claims priority to Chinese Patent Application No. 202010529695.8, titled "SEMICONDUCTOR STRUCTURE", filed on Jun. 11, 2020 with the China National Intellectual Property Administration, which is incorporated herein by reference in its entirety.

FIELD

The present disclosure relates to the technical field of microelectronics, and in particular to a semiconductor structure.

BACKGROUND

Flash memories are widely-applied in nonvolatile computer storage technology. A flash memory usually stores charges in a field-effect transistor by using a floating gate or a charge trapping structure, so as to form a memory unit. An NOR flash memory has a complete random access function and may be used for storing data or program codes.

Conventional NOR flash memories have a storage region and a peripheral drive circuit that are fabricated on a same wafer. The NOR flash memories with such planar structure have a large production cycle, a large spatial occupation, and a low degree of integration.

SUMMARY

A semiconductor structure is provided according to embodiments of the present disclosure. Efficiently addressed is an issue that the NOR flash memory having a planar structure is large, less space are occupied by device, and a degree of integration is increased.

In order to address the above issues, a semiconductor structure is provided according embodiments of the present disclosure. The semiconductor structure includes: a memory-array unit, including a substrate, a memory array disposed on the substrate, and a first bonding region disposed around the memory array; where the memory array includes multiple word lines, multiple bit lines, and multiple source lines, the first bonding region includes a first substrate-connecting bonding region, a first bit-line bonding region, a first word-line bonding region, and a first source-line bonding region; where the first substrate-connecting bonding region is configured to connect the substrate electrically to a surface of the memory-array unit, the first bit-line bonding region is configured to connect the multiple bit lines electrically to the surface of the memory-array unit, the first word-line bonding region is configured to connect the multiple word lines electrically to the surface of the memory-array unit, and the first source-line bonding region is configured to connect the multiple source lines electrically to the surface of the memory-array unit.

In an embodiment, the semiconductor structure further includes: a peripheral-drive-circuit unit, disposed projectively above the memory-array unit, where the peripheral-drive-circuit unit includes a peripheral drive circuit disposed in a central region of the peripheral-drive-circuit unit and a second bonding region disposed around the peripheral-drive-circuit unit; where the second bonding region includes a second substrate-connecting bonding region, a second bit-line bonding region, a second word-line bonding region, and a second source-line bonding region, and the peripheral drive circuit includes a power supply circuit, a word-line decoder circuit, a bit-line decoder circuit, and a source-line decoder circuit; where the first substrate-connecting bonding region and the second substrate-connecting bonding region are bonded to connect the substrate and the power supply circuit electrically, the first bit-line bonding region and the second bit-line bonding region are bonded to connect the bit lines and the bit-line decoder circuit electrically, the first word-line bonding region and the second word-line bonding region are bonded to connect the word lines and the word-line decoder circuit electrically, and the first source-line bonding region and the second source-line bonding region are bonded to connect the source lines and the source-line decoder circuit electrically.

In an embodiment, the peripheral drive circuit further includes a logic circuit, configured to control the word-line decoder circuit, the bit-line decoder circuit, and the source-line decoder circuit.

In an embodiment, the substrate includes a triple p-well and a deep n-well disposed around the triple p-well, the first substrate-connecting bonding region includes multiple first substrate bonding pads arranged at a corner of a region surrounding the memory array, and the multiple first substrate bonding pads connect the triple p-well and the deep n-well electrically to the surface of the memory-array unit.

In an embodiment, the first bit-line bonding region is disposed on at least one side of the memory array.

In an embodiment, all of the multiple bit lines are connected to first bit-line bonding pads in the first bit-line bonding region, which is disposed on one of the at least one side of the memory array, and the first bit-line bonding pads are disposed in a staggered manner.

In an embodiment, every two adjacent bit lines of the multiple bit lines are connected to first bit-line bonding pads in the first bit-line bonding region disposed on two sides, respectively, of the memory array.

In an embodiment, the first word-line bonding region is disposed on at least one side of the memory array.

In an embodiment, the first source-line bonding region is disposed on at least one side of the memory array.

In an embodiment, a dummy source line is disposed among the multiple source lines, and each of the multiple source lines is connected to multiple first source-line bonding pads.

In an embodiment, the memory array has NOR flash architecture.

In an embodiment, the peripheral drive circuit further includes at least one of: an addressing unit for address control, a logic unit for control input and output, a logic unit for control an algorithm, a logic unit for control an instruction state, a static random access memory (SRAM), a unit for control redundancy and replacement, a page buffer, a charge pump, a reference source, a power-on reset unit, a pin, a electro-static discharge (ESD) structure, a power management unit, a digital-to-analog and analog-to-digital converter, or an artificial intelligence algorithm unit.

The present disclosure has following beneficial effects. The semiconductor structure including the memory-array unit is provided according to embodiments of the present disclosure. The memory-array unit includes the substrate, the memory array disposed on the substrate, and the first bonding region disposed around the memory array. The first bonding region includes the first substrate-connecting bonding region, the first bit-line bonding region, the first word-line bonding region, and the first source-line bonding region.

The first substrate-connecting bonding region is configured to connect the substrate electrically to a surface of the memory-array unit, the first bit-line bonding region is configured to connect the bit lines electrically to the surface of the memory-array unit, the first word-line bonding region is configured to connect the word lines electrically to the surface of the memory-array unit, and the first source-line bonding region is configured to connect the source lines electrically to the surface of the memory-array unit. In the semiconductor structure, the peripheral-drive-circuit unit is disposed projectively above the memory-array unit. That is, the peripheral-drive-circuit unit and the memory-array unit are independently provided, so that the peripheral drive circuit is not disposed in the memory-array unit including the memory array. Accordingly, the memory array is not disposed in the peripheral-drive-circuit unit having the peripheral drive circuit. Therefore, when the first bonding region and the corresponding second bonding region in the peripheral-drive-circuit unit are bonded through wafer bonding, the substrate, the multiple word lines, the multiple bit lines, and the multiple source lines in the memory-array unit are electrically connected to respective driving circuits in the peripheral-drive-circuit unit. The semiconductor structure thus has three-dimensional architecture when viewed along the vertical direction, which reduces a dimension of the semiconductor structure.

BRIEF DESCRIPTION OF THE DRAWINGS

For clearer illustration of the technical solutions according to the present disclosure, hereinafter briefly described are the drawings to be applied in embodiments of the present disclosure. Apparently, the drawings in the following descriptions are only some embodiments of the present disclosure, and other drawings may be obtained by those skilled in the art based on the provided drawings without creative efforts.

DETAILED DESCRIPTION

Figure 1:
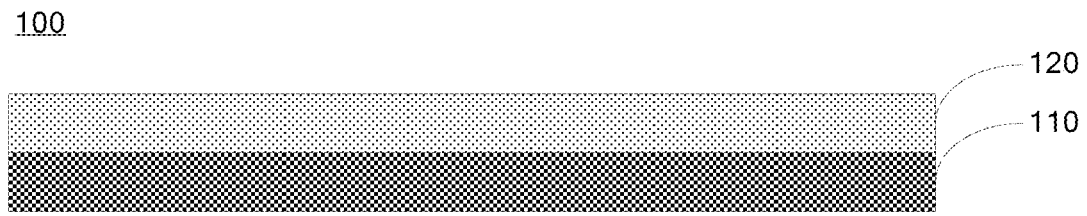
FIG. 1 is a schematic structural diagram of a front view of a semiconductor structure according to an embodiment of the present disclosure.

Hereinafter embodiments are described with reference to the drawings to illustrate examples applicable to the present disclosure. The directional terms mentioned herein, such as "top", "bottom", "front", "back", "left", "right", "inside", "outside", "side" are only directions referring to the drawings. Therefore, such terms are merely intended for explaining and understanding the present disclosure, and not for limiting the present disclosure. In the drawings, units having similar structures are denoted by identical reference numerals.

It should be noted that herein a thickness and a shape in the drawings are not drawn to scale, and are intended for illustrating embodiments schematically.

Embodiments of the present disclosure are provided to address an issue that conventional flash memories having a planar structure are bulky and therefore occupies a large space. NOR flash architecture is taken as an example for illustration.

Reference is made to FIG. 1, which is a schematic structural diagram of a front view of a semiconductor structure according to an embodiment of the present disclosure. Components in the semiconductor structure and a relative position therebetween can be straightforward learnt from FIG. 1.

As shown in FIG. 1, a semiconductor structure 100 includes a memory-array unit 110 and a peripheral-drive-circuit unit 120. The peripheral-drive-circuit unit 120 is disposed projectively above the memory-array unit 110. Herein the memory-array unit 110 and the peripheral-drive-circuit unit 120 may be wafer structures, e.g. two wafers or may be wafer segments. An area of a surface of the memory-array unit 110 may be identical, or substantially identical, to an area of a surface of the peripheral-drive-circuit unit 120. In one embodiment, the memory-array unit 110 includes a substrate and one or more storage transistors fabricated on such substrate, and there may be no peripheral drive/control circuitry, for example, no drive transistor or control transistor, fabricated on the substrate. The peripheral-drive-circuit unit 120 includes another substrate and drive/control circuity, for example, a logic control circuit, which is fabricated on the other substrate and configured to write, read, or delete data into/from the storage transistors.

Figure 2:
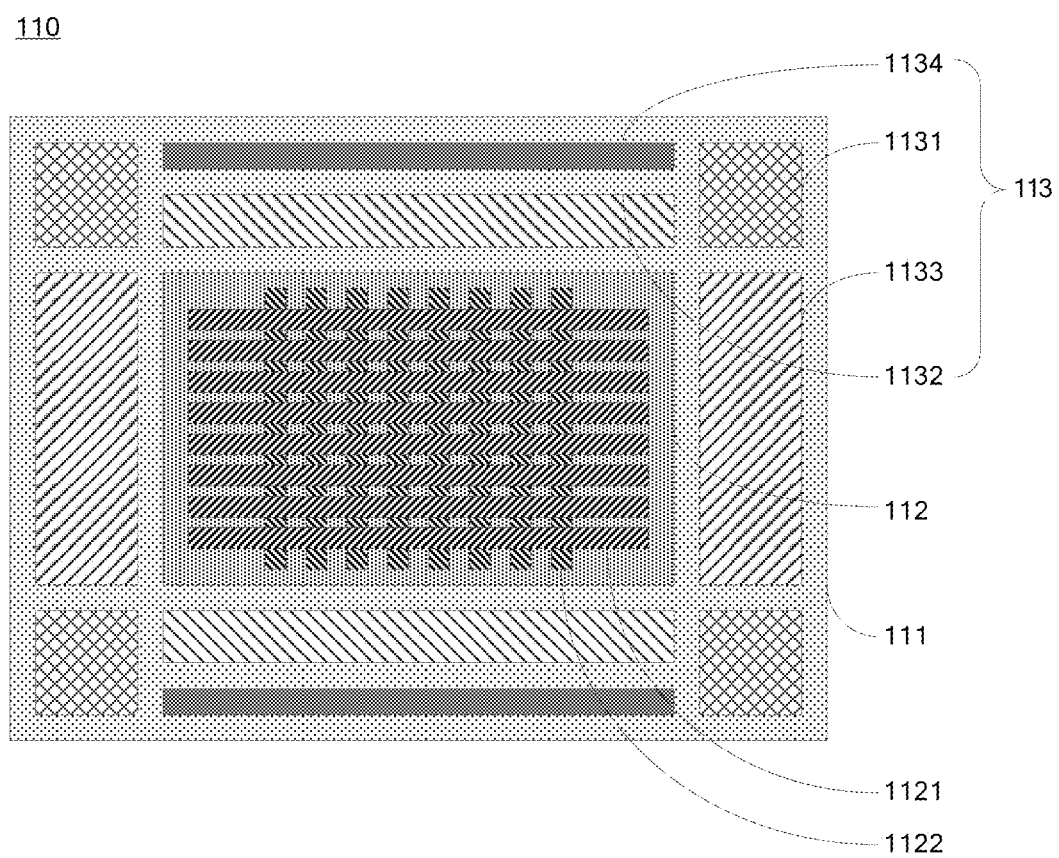
FIG. 2 is a schematic structural diagram of a memory-array unit according to an embodiment of the present disclosure.

Reference is made to FIG. 2, which is a schematic structural diagram of a memory-array unit 110 according to an embodiment of the present disclosure. Components of the memory-array unit 110 and a relative position therebetween can be straightforward learnt from FIG. 2.

The memory-array unit 110 includes a substrate 111, a memory array 112 disposed on the substrate 111, and a first bonding region 113 disposed around the memory array 112. As shown in FIG. 2, in this embodiment, a first bit-line bonding region 1132 and a first word-line bonding region 1133, which are in the first bonding region 113, are not overlapped with the memory array 112 when viewed along a projection direction.

In another embodiment, the first bit-line bonding region 1132 and the first word-line bonding region 1133 in the first bonding region 113 may be partially overlapped with the memory array 112 when viewed along the projection direction.

The memory array 112 includes multiple word lines 1121, multiple bit lines 1122, and multiple source lines (not shown in FIG. 2). The first bonding region 113 includes a first substrate-connecting bonding region 1131, the first bit-line bonding region 1132, the first word-line bonding region 1133, and a first source-line bonding region 1134. On the memory-array unit 110, the first substrate-connecting bonding region 1131 may be configured to connect the substrate 111 electrically to a surface of the memory-array unit 110, the first bit-line bonding region 1132 may be configured to connect the bit lines 1122 electrically to the surface, the second word-line bonding region 1133 may be configured to connect the word lines 1121 electrically to the surface, and the first source-line bonding region 1134 may be configured to connect the source lines electrically to the surface.

In one embodiment, the first substrate-connecting bonding region 1131 may be disposed at any corner of the region surrounding the memory array 112. Specifically, the first substrate-connecting bonding region 1131 may be distributed among one or more corners, of which a quantity ranges from 1 to 4. The first bit-line bonding region 1132 may be disposed on at least one side of the memory array 112. Specifically, the first bit-line bonding region 1132 may be disposed on only one side of the memory array 112 or on two sides of the memory array 112. The first word-line bonding region 1133 may be disposed on at least one side of the memory array 112. Specifically, the first word-line bonding region 1133 may be disposed on only one side of the memory array 112 or on two sides of the memory array 112. The first source-line bonding region 1134 may be disposed on at least one side of the memory array 112. Specifically, the first source-line bonding region 1134 may be disposed on only one side of the memory array 112 or on two sides of the memory array 112.

In one embodiment, the memory array 112 may have NOR flash architecture.

Figure 3:
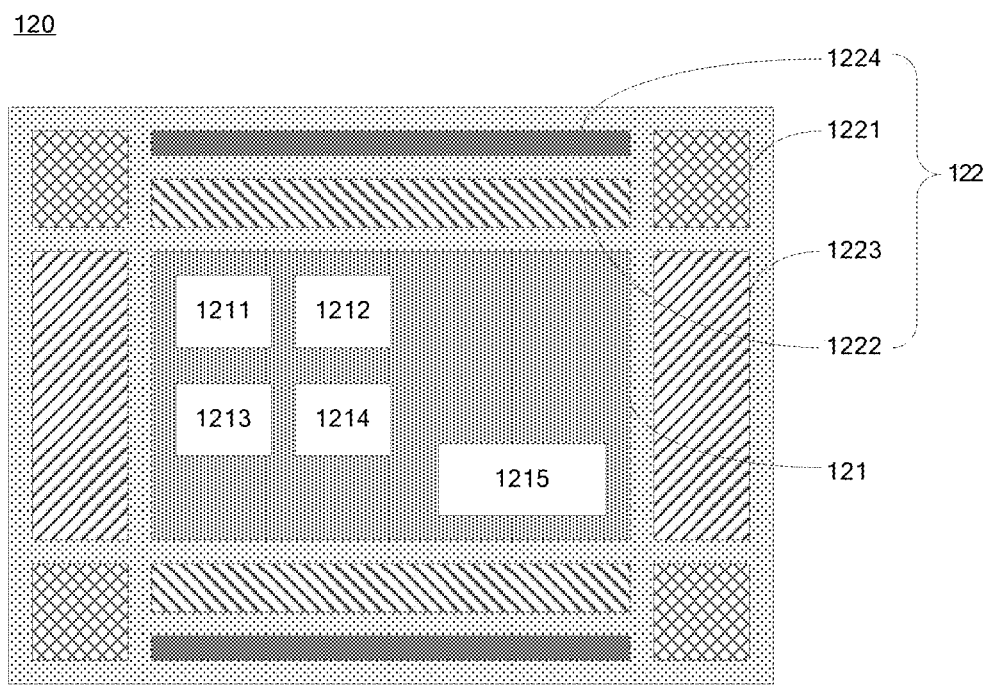
FIG. 3 is a schematic structural diagram of a peripheral-drive-circuit unit according to an embodiment of the present disclosure.

Reference is made to FIG. 3, which is a schematic structural diagram of a peripheral-drive-circuit unit 120 according to an embodiment of the present disclosure. Components in the peripheral-drive-circuit unit 120 and a relative position relationship therebetween may be straightforward learnt from FIG. 3.

As shown in FIG. 3, the peripheral-drive-circuit unit 120 includes a peripheral drive circuit 121, which is disposed in a central region of the peripheral-drive-circuit unit 120, and a second bonding region 122, which is disposed around the peripheral-drive-circuit unit 120. The second bonding region 122 is configured to connect the peripheral drive circuit 121 and bond correspondingly with the first bonding region 113. Thereby, connection between the peripheral drive circuit 121 and the memory array 112 can be implemented.

The peripheral drive circuit 121 includes a power supply circuit 1211, a word-line decoder circuit 1212, a bit-line decoder circuit 1213, and a source-line decoder circuit 1214. The power supply circuit 1211 is configured to supply power to the substrate 111, the word-line decoder circuit 1212 is configured to output a control signal on the word lines, the bit-line decoder circuit 1213 is configured to output a control signal on the bit lines, and the source-line decoder circuit 1214 is configured to output a control signal on the source lines.

In one embodiment, the peripheral drive circuit 121 further includes a logic circuit 1215. The logic circuit 1215 is configured to control the word-line decoder circuit 1212, the bit-line decoder circuit 1213, and the source-line decoder circuit 1214.

In one embodiment, the peripheral drive circuit 121 may includes at least one of: an addressing unit for address control, a logic unit for controlling input and output, a logic unit for controlling algorithm, a logic unit for controlling instruction state, a static random access memory (SRAM), a unit for controlling redundancy and replacement, a page buffer, a charge pump, a reference source, a power-on reset unit, a pin, an electro-static discharge (ESD) unit, a power management unit, a digital-to-analog and analog-to-digital converter, or an artificial intelligence algorithm unit.

In one embodiment, the second bonding region 122 includes a second substrate-connecting bonding region 1221, a second bit-line bonding region 1222, a second word-line bonding region 1223, and a second source-line bonding region 1224. On the peripheral-drive-circuit unit 120, the second substrate-connecting bonding region 1221 is configured to connect the power supply circuit 1211 electrically to a surface of the peripheral-drive-circuit 120, the second bit-line bonding region 1222 is configured to connect the bit-line decoder circuit 1213 electrically to the surface, the second word-line bonding region 1223 is configured to connect the word-line decoder circuit 1212 electrically to the surface, and the second source-line bonding region 1224 is configured to connect the source-line decoder circuit 1214 electrically to the surface.

In one embodiment, the second substrate-connecting bonding region 1221 may be disposed at a corner of the region around the peripheral drive circuit 121. Specifically, the second substrate-connecting bonding region 1221 is distributed among one or more corners, of which a quantity ranges from 1 to 4. The second bit-line bonding region 1222 may be disposed on at least one side of the peripheral drive circuit 121. Specifically, the second bit-line bonding region 1222 may be disposed on only one side of the peripheral drive circuit 121 or on two sides of the peripheral drive circuit 121. The second word-line bonding region 1223 may be disposed on at least one side of the peripheral drive circuit 121. Specifically, the second word-line bonding region 1223 may be disposed on only one side of the peripheral drive circuit 121 or on two sides of the peripheral drive circuit 121. The second source-line bonding region 1224 may be disposed on at least one side of the peripheral drive circuit 121. Specifically, the second source-line bonding region 1224 may be disposed on only one side of the peripheral drive circuit 121 or on two sides around the peripheral drive circuit 121. In addition, the arrangement within the second bonding region 122 is the same as the arrangement within the first bonding regions 113, such that the second bonding region 122 and the first bonding regions 113 can be correspondingly bonded.

In one embodiment, when the memory-array unit 110 and the peripheral-drive-circuit unit 120 are bonded through wafer bonding, bonding regions in the first bonding region 113 are aligned with and connected to corresponding bonding regions in the second bonding region 122, respectively. Specifically, the first substrate-connecting bonding region 1131 and the second substrate-connecting bonding region 1221 are bonded to connect the substrate 111 in the memory-array unit 110 and the power supply circuit 1211 in the peripheral-drive-circuit unit 120 electrically. The first bit-line bonding region 1132 and the second bit-line bonding region 1222 are bonded to connect the bit lines 1122 in the memory-array unit 110 and the bit-line decoder circuit 1213 in the peripheral-drive-circuit unit 120 electrically. The first word-line bonding region 1133 and the second word-line bonding region 1223 are bonded to connect the word lines 1121 in the memory-array unit 110 and the word-line decoder circuit 1212 in the peripheral-drive-circuit unit 120 electrically. The first source-line bonding region 1134 and the second source-line bonding region 1224 are bonded to connect the source lines in the memory-array unit 110 and the source-line decoder circuit 1214 in the peripheral-drive-circuit unit 120 electrically.

Figure 4:
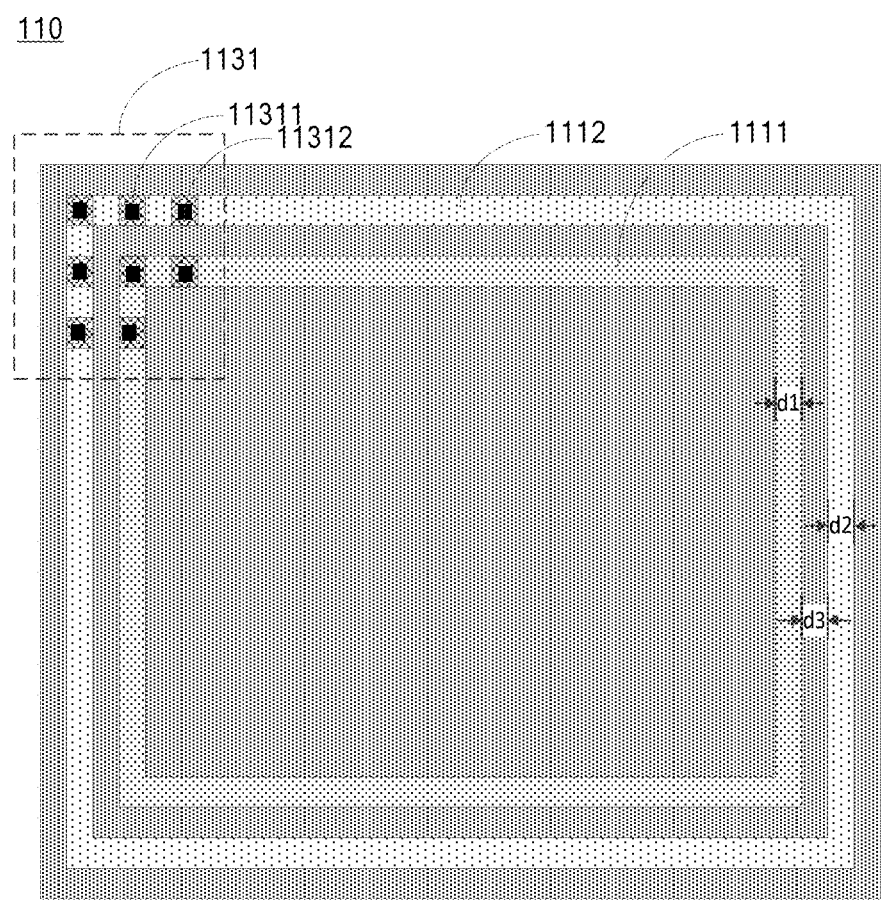
FIG. 4 is a schematic structural diagram of a first substrate-connecting bonding region according to an embodiment of the present disclosure.

Reference is made to FIG. 4, which is a schematic structural diagram of a first substrate-connecting bonding region 1131 according to an embodiment of the present disclosure. Components in the first substrate-connecting bonding region 1131 and a relative position relationship therebetween may be straightforward learnt from FIG. 4.

As shown in FIG. 4, the substrate 111 may include a triple p-well 1111 and a deep n-well 1112. The deep n-well 1112 may be disposed around the triple p-well 1111, and is configured to isolate different devices from each other. A width of the triple p-well 1111 is denoted by d1, a width of the deep n-well 1112 is denoted by d2, and a distance between the triple p-well 1111 and the deep n-well 1112 is denoted by d3. Each of d1, d2 and d3 may be determined according to an actual situation.

The first substrate-connecting bonding region 1131 may include multiple first substrate bonding pads 11311, which connect the triple p-well 1111 and the deep n-well 1112 electrically to a surface and are disposed at any corner of the region surrounding the memory array 112. The first substrate bonding pads 11311 are configured to bond with second substrate bonding pads, which are in the second substrate-connecting bonding region 1221 and are connected to the power supply circuit 1211. Thereby, the power supply circuit 1211 supplies a bias voltage to the substrate 111.

The triple p-well 1111 may correspond to only one first substrate bonding pad 11311 or multiple first substrate bonding pads 11311. In FIG. 4, it is taken as an example that there are three first substrate bonding pads 11311 connected to the triple p-well 1111. The deep n-well 1112 may correspond to one first substrate bonding pad 11311 or multiple first substrate bonding pads 11311. In FIG. 4, it is taken as an example that there are five first substrate bonding pads 11311 connected to the deep n-well 1112.

The first substrate bonding pad 11311 may be disposed on a surface of the second substrate-connecting bonding region 1221 away from the substrate. The first substrate bonding pad 11311 may be connected to the substrate 111 via a vertical metal line 11312. A dielectric layer may be formed between the first substrate bonding pad 11311 and the substrate 111. The metal line 11312 is formed in a through hole penetrating the dielectric layer.

Alternatively, the doped wells in the substrate 111 may be oppositely doped.

The first bit-line bonding region 1132 may be disposed on at least one side of the memory array 112. Each first bit-line bonding region 1132 may include multiple first bit-line bonding pads 11321 that are connected to the multiple bit lines 1122, respectively. The first bit-line bonding pads 11321 are bonded to second bit-line bonding pads, which are in the second bit-line bonding region 1222 and are connected to the bit-line decoder circuit 1213.

Figure 5:
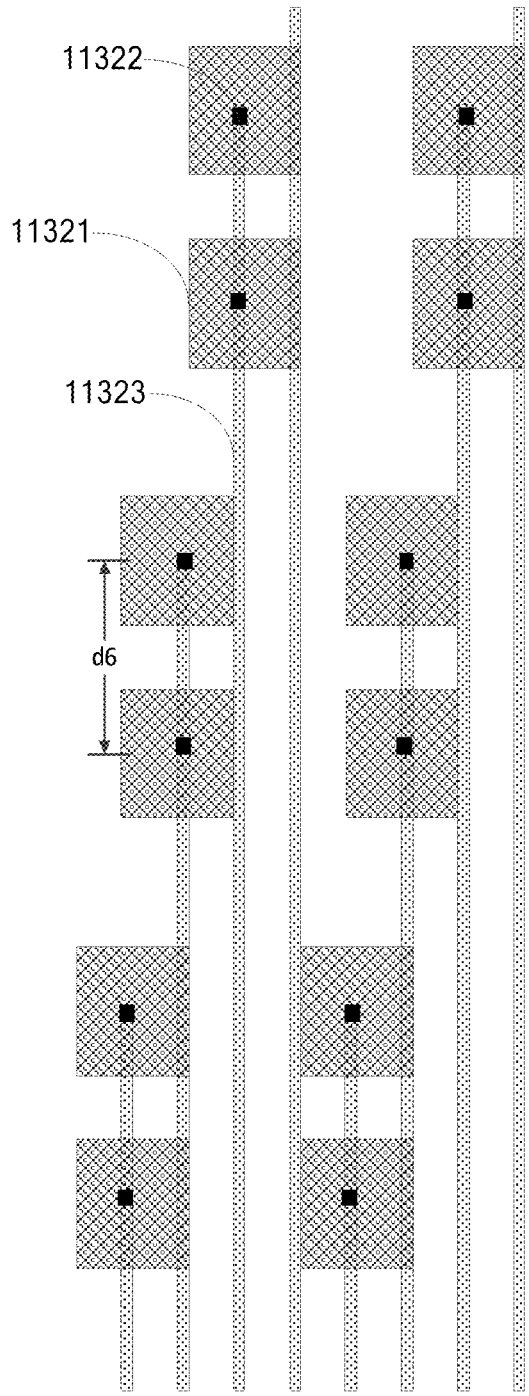
FIG. 5 is a schematic structural diagram of a first bit-line bonding region according to an embodiment of the present disclosure.

Reference is made to FIG. 5, which is a schematic structural diagram of a first bit-line bonding region 1132 according to an embodiment of the present disclosure. Components in the first bit-line bonding region 1132 and a relative position relationship therebetween may be straightforward learnt from FIG. 5.

FIG. 5 shows a scenario in which the first bit-line bonding region 1132 is disposed above the bit lines 1122, and each bit line 1122 is connected to the first bit-line bonding pads 11321 above the memory array 112. Each bit line 1122 may be provided with one first bit-line bonding pad 11321 or multiple first bit-line bonding pads 11321. As shown in FIG. 5, two first bit-line bonding pads 11321 are connected to each bit line 1122. A distance between such two first bit-line bonding pads 11321 may be denoted by d6, of which a value may be determined according to an actual situation.

The first bit-line bonding pad 11321 may be disposed on a surface of the first bit-line bonding region 1132 away from the substrate 111. The first bit-line bonding pad 11321 may be connected to the bit line 1122 via a vertical metal line 11322, or via a vertical metal line 11322 and a lateral lead line 11323. Herein the "vertical" refers to a direction perpendicular to the substrate, and the "lateral" refers to a direction parallel to the substrate. Specifically, a dielectric layer may be formed between the first bit-line bonding pads 11321 and the bit lines 1122, the metal line 11322 may be formed in a through hole penetrating the dielectric layer. The lead line 11323 may be formed in the same layer as the bit lines 1122.

Reference is made to FIG. 5. Each bit line 1122 is connected to two first bit-line bonding pads 11321 above the bit line 1122. The first bit-line bonding pads 11321 may be disposed in a staggered manner, and lead lines 11323 of the bit lines 1122 have non-uniform lengths. Thereby, a distance between the first bit-line bonding pads 11321 would not be too close, as a case of the uniform lengths, reducing possibility of short circuit.

FIG. 5 shows a top view of the memory-array unit 110. It is appreciated that even if the first bit-line bonding pads 11321 connected to a first bit line 1122 is depicted to overlap with a second bit line 1122 projectively, these first bit-line bonding pads 11321 are not connected to the second bit line 1122. Such positional relationship also applies to other bit lines 1122 and other first bit-line bonding pads 11321.

Figure 6:
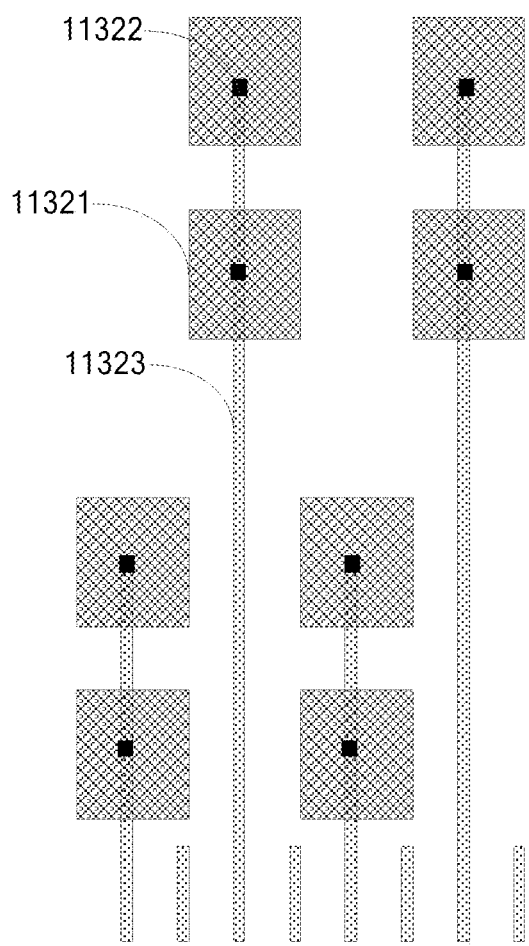
FIG. 6 is a schematic structural diagram of a first bit-line bonding region according to another embodiment of the present disclosure.

In addition, the first bit-line bonding region 1132 may be disposed both above and beneath the bit lines 1122, and every two adjacent bit lines 1122 are connected to the first bit-line bonding pads 11321 disposed on two sides, respectively, of the memory array 112. In such case, a half of the bit lines 1122 may be connected to first bit-line bonding pads 11321 disposed above the bit lines 1122, and the other half of the bit lines 1122 may be connected to first bit-line bonding pads 11321 disposed beneath the bit lines 1122. Reference is made to FIG. 6, which is a schematic structural diagram of a first bit-line bonding region according to another embodiment of the present disclosure. Specifically, FIG. 6 shows a schematic diagram of the first bit-line bonding region disposed above the bit lines in a scenario in which the first bit-line bonding regions 1132 are disposed both above and beneath the bit lines 1122. The depicted first bit-line bonding pads 11321 are only connected to a part of the bit lines 1122. Specifically, the first one, the third one, the fifth one, and the like, of the bit lines 1122 are connected to the first bit-line bonding pads 11321 disposed above the bit lines 1122 via the lead lines 11323. The second one, the fourth one, the sixth one, and the like, of the bit lines 1122 are not connected to the first bit-line bonding pads 11321 disposed above the bit lines 1122, but to the first bit-line bonding pads 11321 disposed beneath the bit lines 1122 (not depicted in FIG. 6). Thereby, a gap between adjacent first bit-line bonding pads 11321 can be increased to avoid short circuit.

The first word-line bonding region 1133 may be disposed on at least one side of the memory array 112. Each first word-line bonding region 1133 may include multiple first word-line bonding pads 11331 that are connected to the multiple word lines 1121, respectively. The first word-line bonding pads 11331 are configured to bond with second word-line bonding pads, which are in the second word-line bonding region 1223 and are connected to the word-line decoder circuit 1212.

Figure 7:
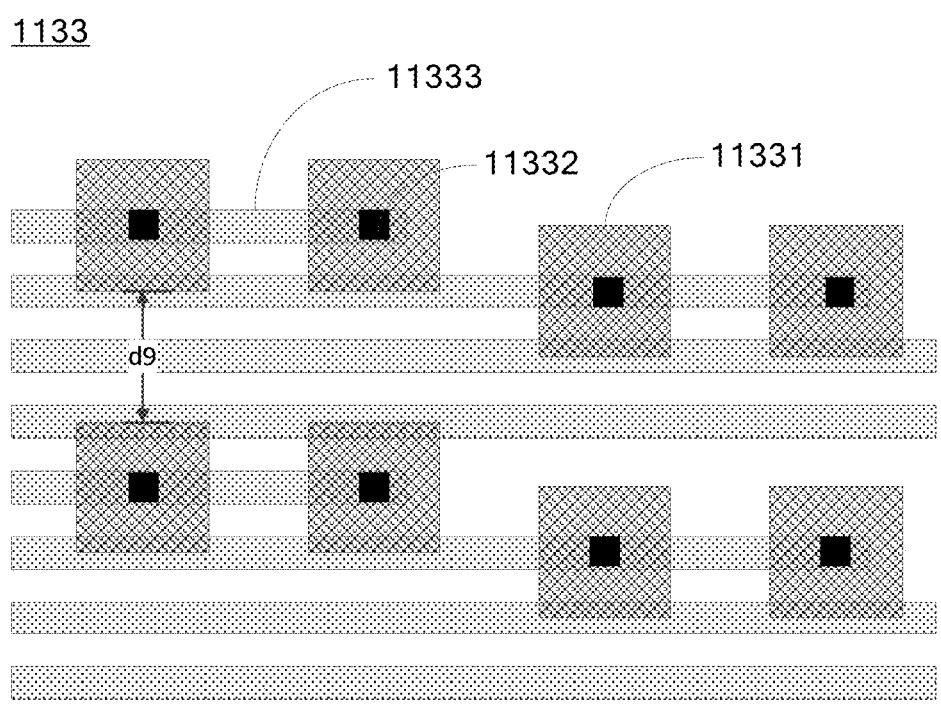
FIG. 7 is a schematic structural diagram of a first word-line bonding region according to an embodiment of the present disclosure.

Reference is made to FIG. 7, which is a schematic structural diagram of a first word-line bonding region 1133 according to an embodiment of the present disclosure. Components in the first word-line bonding region 1133 and a relative position relationship therebetween may be straightforward learnt from FIG. 7.

FIG. 7 shows a scenario in which the first word-line bonding pads 11331 are merely disposed on right of the word lines 1121. In such case, all word lines 1121 are required to be connected to the first word-line bonding pads 11331 on right of the word lines 1121. Each word line 1121 is provided with one first word-line bonding pad 11331 or multiple first word-line bonding pads 11331. As shown in FIG. 7, each word line 1122 is connected to two first word-line bonding pads 11331.

The first word-line bonding pads 11331 may be disposed on a surface of the first word-line bonding region 1133 away from the substrate 111. The first word-line bonding pad 11331 may be connected to the word line 1121 via a vertical metal line 11332, or the first word-line bonding pad 11331 may be connected to the word line 1121 via a vertical metal line 11332 and a lateral lead line 11333. Specifically, a dielectric layer may be formed between the first word-line bonding pads 11331 and the word lines 1121, and the metal line 11332 may be formed in a through hole penetrating the dielectric layer. The lead line 11333 may be formed in the same layer as the word lines 1121.

As shown in FIG. 7, each word line 1121 is connected to two first word-line bonding pads 11311 disposed above the word line 1121. The first word-line bonding pads 11331 may be disposed in a staggered manner, and lead lines 11333 of the bit lines 1122 have non-uniform lengths. Thereby, a distance between the first word-line bonding pads 11331 would not be too close, as a case of uniform length, reducing a possibility of short circuit.

As shown in FIG. 7, counting from the top, first word-line bonding pads 11331 connected to the second word line 1121 may be disposed on right of the first word line 1121, and first word-line bonding pads 11331 connected to the third word line 1121 and the fourth word line 1121 are not depicted. A distance between edges of two first word-line bonding pads 11331 that are top-down aligned is denoted by d9, of which a value may be determined according to an actual situation.

FIG. 7 shows a top view of the memory-array unit 110. It is appreciated that even if the first word-line bonding pads 11331 connected to the first word line 1121 is depicted to overlap with the second word line 1121 projectively, these first word-line bonding pads 11331 are not connected to the second word line 1121. Such positional relationship also applies to other word lines 1121 and other first word-line bonding pad 11331.

In a case that the first word-line bonding pads 11331 are disposed on two sides of the word lines 1121, a half of the word lines 1121 may be connected to first word-line bonding pads 11331 disposed on right of the word lines 1121, and the other half of the word lines 1121 may be connected to first word-line bonding pads 11331 disposed on left of the word lines 1121. A manner of the connection may refer to the description concerning the bit lines 1122, and is not illustrated or explained herein.

The first source-line bonding region 1134 may be disposed on at least one side around the memory array 112. Each first source-line bonding region 1134 may include multiple first source-line bonding pads 11341 which are connected to the multiple source lines 1123, respectively. The first source-line bonding pads 11341 are configured to bond with second source-line bonding pads, which are in the second source-line bonding region 1224 and are connected to the source-line decoder circuit 1214.

Figure 8:
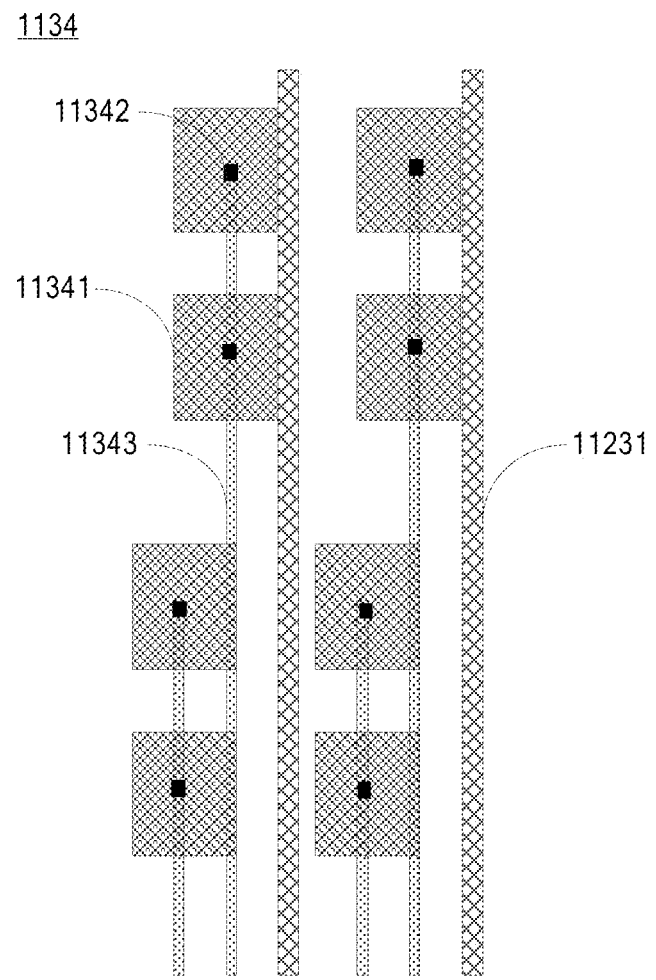
FIG. 8 is a schematic structural diagram of a first source-line bonding region according to an embodiment of the present disclosure.

Reference is made to FIG. 8, which is a schematic structural diagram of a first source-line bonding region 1134 according to an embodiment of the present disclosure. Components in the first source-line bonding region 1134 and a relative position relationship therebetween may be straightforward learnt from FIG. 8.

FIG. 8 shows a scenario in which the first source-line bonding pads 11341 are disposed above the memory array 112, and each source line 1123 is connected to the first source-line bonding pads 11341 above the memory array 112. Each source line 1123 is provided with one first source-line bonding pad 11341 or multiple first source-line bonding pads 11341, for example, two first source-line bonding pads 11341.

The first source-line bonding pads 11341 may be disposed on a surface of the first source-line bonding region 1134 away from the substrate 111. The first source-line bonding pad 11341 may be connected to the source line 1123 via a vertical metal line 11342, or via a vertical metal line 11342 and a lateral lead line 11343. Specifically, a dielectric layer may be formed between the first source-line bonding pads 11341 and the source lines 1123, and the metal line 11342 may be formed in a through hole penetrating the dielectric layer. The lead line 11343 may be formed in the same layer as the source lines 1123.

As shown in FIG. 8, each source line 1123 is connected to two first source-line bonding pads 11341 disposed above the source line 1123. The first source-line bonding pads 11341 may be disposed in a staggered manner, and the lead lines 11343 of the source lines 1123 have non-uniform lengths. Thereby, a distance between the first source-line bonding pads 11341 would not be too close, as a case of non-uniform lengths, reducing a possibility of short circuit.

As shown in FIG. 8, counting from the left, first source-line bonding pads 11341 connected to the second source line 1123 may be disposed on the right side of the first source-line bonding pad 11341 connected to the first source line 1123.

FIG. 8 shows a top view of the memory-array unit 110. It is appreciated that even if the first source-line bonding pads 11341 connected to the first source line 1123 is depicted to overlapped with the second source line 1123 projectively, these first source-line bonding pads 11341 are not connected to the second source line 1123. Such positional relationship also applies to other source lines 1123 and other first source-line bonding pads 11341.

In another embodiment, the first source-line bonding region 1134 may be disposed both above and beneath the memory array 112. A half of the source lines 1123 is connected to the first source-line bonding pads 11341 disposed above the memory array 112, and the other half of the source lines 1123 is connected to the first source-line bonding pads 11341 disposed beneath the memory array 112 (not depicted in FIG. 8).

The first source-line bonding region 1134 may be adjacent to the first bit-line bonding region 1132, or may be adjacent to the first word-line bonding region 1133. The first source-line bonding region 1134 may be disposed at a side of the word lines 1121 along the extending direction of the word lines 1121, or at a side of the bit lines 1122 along the extending direction of the bit lines 1122.

In one embodiment, a dummy source line 11231 is inserted into the multiple source lines 1123 at an interval of every two source lines 1123. Each source line 1123 is provided with multiple first source-line bonding pads 11341.

The semiconductor structure including the memory-array unit is provided according to embodiments of the present disclosure. The memory-array unit includes the substrate, the memory array disposed on the substrate, and the first bonding region disposed around the memory array. The first bonding region includes the first substrate-connecting bonding region, the first bit-line bonding region, the first word-line bonding region, and the first source-line bonding region. The first substrate-connecting bonding region is configured to connect the substrate electrically to the surface of the memory-array unit, the first bit-line bonding region is configured to connect the bit lines electrically to the surface of the memory-array unit, the first word-line bonding region is configured to connect the word lines electrically to the surface of the memory-array unit, and the first source-line bonding region is configured to connect the source lines electrically to the surface of the memory-array unit. In the semiconductor structure, the peripheral-drive-circuit unit is disposed projectively above the memory-array unit. That is, the peripheral-drive-circuit unit and the memory-array unit are independently provided or fabricated on different substrates, so that the peripheral drive circuit is not disposed in the memory-array unit including the memory array. Accordingly, the memory array is not disposed in the peripheral-drive-circuit unit having the peripheral drive circuit. Therefore, when the first bonding region and the corresponding second bonding region in the peripheral-drive-circuit unit are bonded through wafer bonding, the substrate, the multiple word lines, the multiple bit lines, and the multiple source lines in the memory-array unit are electrically connected to respective driving circuits in the peripheral-drive-circuit unit. The semiconductor structure thus has three-dimensional architecture when viewed along the vertical direction, which reduces a dimension of the semiconductor structure.

The present disclosure may further be implemented as embodiments other than the foregoing embodiments. All technical solutions formed by equivalent replacement shall fall within the protection scope of the present disclosure.

Although the preferable embodiments of the present disclosure are disclosed as above, the preferable embodiments are not intended for limiting the present disclosure. Those skilled in the art can make various modifications and refinements without departing from the spirit and scope of the present disclosure. Therefore, the protection scope of the present disclosure is subject to the scope defined in the claims.

The invention claimed is:

1. A semiconductor structure, comprising:
a memory-array unit, comprising a substrate, a memory array disposed on the substrate, and a first bonding region disposed around the memory array, wherein:
the memory array comprises a plurality of word lines, a plurality of bit lines, and a plurality of source lines;
the first bonding region comprises a first substrate-connecting bonding region, a first bit-line bonding region, a first word-line bonding region, and a first source-line bonding region; and
the first substrate-connecting bonding region is configured to connect the substrate electrically to a surface of the memory-array unit, the first bit-line bonding region is configured to connect the plurality of bit lines electrically to the surface of the memory-array unit, the first word-line bonding region is configured to connect the plurality of word lines electrically to the surface of the memory-array unit, and the first source-line bonding region is configured to connect the plurality of source lines electrically to the surface of the memory-array unit,
wherein the memory array has NOR flash architecture.

2. The semiconductor structure according to claim 1, further comprising:
a peripheral-drive-circuit unit, comprising a peripheral drive circuit and a second bonding region disposed around the peripheral-drive-circuit unit, wherein the peripheral-drive-circuit unit and the memory-array unit are bonded via the first bonding region and the second bonding region;
wherein the second bonding region comprises a second substrate-connecting bonding region, a second bit-line bonding region, a second word-line bonding region, and a second source-line bonding region;
wherein the first substrate-connecting bonding region and the second substrate-connecting bonding region are bonded, the first bit-line bonding region and the second bit-line bonding region are bonded, the first word-line bonding region and the second word-line bonding region are bonded, and the first source-line bonding region and the second source-line bonding region are bonded.

3. The semiconductor structure according to claim 2, wherein:
the peripheral drive circuit comprises a power supply circuit, a word-line decoder circuit, a bit-line decoder circuit, and a source-line decoder circuit; and
wherein the second substrate-connecting bonding region is electrically connected to the power supply circuit, the second bit-line bonding region is electrically connected to the bit-line decoder circuit, the second word-line bonding region is electrically connected to the word-line decoder circuit, and the second source-line bonding region is electrically connected to the source-line decoder circuit.

4. The semiconductor structure according to claim 2, wherein:
each of the memory-array unit and the peripheral-drive-circuit unit is a wafer, or
each of the memory-array unit and the peripheral-drive-circuit unit is a wafer segment.

5. The semiconductor structure according to claim 3, wherein the peripheral drive circuit further comprises:
a logic circuit, configured to control the word-line decoder circuit, the bit-line decoder circuit, and the source-line decoder circuit.

6. The semiconductor structure according to claim 3, wherein the peripheral drive circuit further comprises at least one of:
an addressing unit for address control, a logic unit for control input and output, a logic unit for control an algorithm, a logic unit for control an instruction state, a static random access memory (SRAM), a unit for control redundancy and replacement, a page buffer, a charge pump, a reference source, a power-on reset unit, a pin, a electro-static discharge (ESD) structure, a power management unit, a digital-to-analog and analog-to-digital converter, or an artificial intelligence algorithm unit.

7. A semiconductor structure, comprising:
a memory-array unit, comprising a substrate, a memory array disposed on the substrate, and a first bonding region disposed around the memory array, wherein:
the memory array comprises a plurality of word lines, a plurality of bit lines, and a plurality of source lines;
the first bonding region comprises a first substrate-connecting bonding region, a first bit-line bonding region, a first word-line bonding region, and a first source-line bonding region; and the first substrate-connecting bonding region is configured to connect the substrate electrically to a surface of the memory-array unit, the first bit-line bonding region is configured to connect the plurality of bit lines electrically to the surface of the memory-array unit, the first word-line bonding region is configured to connect the plurality of word lines electrically to the surface of the memory-array unit, and the first source-line bonding region is configured to connect the plurality of source lines electrically to the surface of the memory-array unit, wherein:

the substrate comprises a triple p-well and a deep n-well that is disposed around the triple p-well, the first substrate-connecting bonding region comprises a plurality of first substrate bonding pads disposed at a corner of a region surrounding the memory array, and the plurality of first substrate bonding pads connects the triple p-well and the deep n-well electrically to the surface of the memory-array unit.

8. The semiconductor structure according to claim 1, wherein the first bit-line bonding region is disposed on at least one side of the memory array.

9. The semiconductor structure according to claim 8, wherein:

the plurality of bit lines are connected to first bit-line bonding pads in the first bit-line bonding region, which is disposed on one of the at least one side of the memory array, and the first bit-line bonding pads are disposed in a staggered manner.

10. The semiconductor structure according to claim 8, wherein every two adjacent bit lines of the plurality bit lines are connected to first bit-line bonding pads in the first bit-line bonding region disposed on two sides, respectively, of the memory array.

11. The semiconductor structure according to claim 1, wherein the first word-line bonding region is disposed on at least one side of the memory array.

12. The semiconductor structure according to claim 1, wherein the first source-line bonding region is disposed on at least one side of the memory array.

13. The semiconductor structure according to claim 12, wherein a dummy source line is disposed among the plurality of source lines, and each source line of the plurality of source lines is connected to a plurality of first source-line bonding pads.

14. The semiconductor structure according to claim 1, wherein each of the first bit-line bonding region, the first word-line bonding region, and the first source-line bonding region is disposed on at least one side of the memory array, and the first substrate-connecting bonding region is disposed on at least one corner of a region surrounding the memory array.

15. The semiconductor structure according to claim 2, wherein each of the second bit-line bonding region, the second word-line bonding region, and the second source-line bonding region is disposed on at least one side of the peripheral drive circuit, the second substrate-connecting bonding region is disposed on at least one corner of a region around the peripheral drive circuit, peripheral drive circuit the, and an arrangement within the second bonding region is the same as an arrangement within the first bonding region, such that the second bonding region and the first bonding regions are correspondingly bonded.

16. The semiconductor structure according to claim 2, wherein the memory-array unit and the peripheral-drive-circuit unit are disposed on different wafers, and the memory-array unit and the peripheral-drive-circuit unit are bonded through wafer bonding.

17. The semiconductor structure according to claim 1, wherein the first bonding region is partially overlapped or not overlapped with the memory array when viewed in in the direction perpendicular to the substrate.

* * * * *